(12) United States Patent
Pack et al.

(10) Patent No.: US 7,302,672 B2
(45) Date of Patent: Nov. 27, 2007

(54) METHOD AND SYSTEM FOR CONTEXT-SPECIFIC MASK WRITING

(75) Inventors: Robert C. Pack, Foster City, CA (US); Louis Scheffer, Campbell, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 223 days.

(21) Appl. No.: 11/143,361

(22) Filed: Jun. 1, 2005

(65) Prior Publication Data

US 2005/0216877 A1 Sep. 29, 2005

Related U.S. Application Data

(63) Continuation-in-part of application No. 10/620,285, filed on Jul. 14, 2003.

(60) Provisional application No. 60/395,415, filed on Jul. 12, 2002.

(51) Int. Cl.
*G06F 17/50* (2006.01)
(52) U.S. Cl. .......................... 716/19; 716/21
(58) Field of Classification Search ............ 716/19–21; 430/5, 22, 30
See application file for complete search history.

(56) References Cited

U.S. PATENT DOCUMENTS

| | | | |
|---|---|---|---|
| 4,247,203 A | 1/1981 | Levy et al. |
| 5,553,273 A | 9/1996 | Liebmann |
| 5,553,274 A | 9/1996 | Liebmann |
| 5,567,550 A | 10/1996 | Smayling |
| 5,580,687 A | 12/1996 | Leedy |
| 5,740,068 A | 4/1998 | Liebmann et al. |
| 5,821,014 A | 10/1998 | Chen et al. |
| 5,879,866 A | 3/1999 | Starikov et al. |
| 5,932,377 A | 8/1999 | Ferguson et al. |
| 5,965,306 A | 10/1999 | Mansfield et al. |
| 6,051,347 A | 4/2000 | Tzu et al. |
| 6,168,891 B1 | 1/2001 | Shibata |
| 6,282,696 B1 | 8/2001 | Garza et al. |
| 6,285,488 B1 | 9/2001 | Sandstrom |
| 6,421,820 B1 | 7/2002 | Mansfield et al. |
| 6,456,899 B1 | 9/2002 | Gleason et al. |
| 6,526,550 B1 | 2/2003 | Badding et al. |
| 6,529,621 B1 | 3/2003 | Glasser et al. |
| 6,535,774 B1 | 3/2003 | Bode et al. |
| 6,560,766 B2 | 5/2003 | Pierrat et al. |
| 6,571,383 B1 | 5/2003 | Butt et al. |

(Continued)

FOREIGN PATENT DOCUMENTS

EP 1031876 A 8/2000

OTHER PUBLICATIONS

Matsuyama, T. et al. "The novel inspection system with design rule check for high accuracy reticules" Proceedings of the SPIE—The International Society of Optical Engineering (1999) 3748:563-571.

(Continued)

*Primary Examiner*—Jack Chiang
*Assistant Examiner*—Binh Tat
(74) *Attorney, Agent, or Firm*—Bingham McCutchen LLP

(57) ABSTRACT

A method for generating lithography masks includes generating integrated circuit design data and using context information from the integrated circuit design data to write a mask.

24 Claims, 7 Drawing Sheets

U.S. PATENT DOCUMENTS

| | | |
|---|---|---|
| 6,578,188 B1 | 6/2003 | Pang et al. |
| 6,579,651 B2 | 6/2003 | Subramanian et al. |
| 6,625,801 B1 | 9/2003 | Pierrat et al. |
| 6,634,018 B2 | 10/2003 | Randall et al. |
| 6,658,640 B2 | 12/2003 | Weed |
| 6,670,082 B2 | 12/2003 | Liu et al. |
| 6,703,167 B2 | 3/2004 | LaCour |
| 6,748,578 B2 | 6/2004 | Cobb |
| 6,787,271 B2 | 9/2004 | Cote et al. |
| 6,868,537 B1 * | 3/2005 | Ho et al. ............... 716/19 |
| 6,901,574 B2 | 5/2005 | LaCour et al. |
| 7,107,571 B2 * | 9/2006 | Chang et al. ............ 716/19 |
| 2002/0026626 A1 | 2/2002 | Randall et al. |
| 2002/0102476 A1 | 8/2002 | Hayano et al. |
| 2002/0155357 A1 | 10/2002 | LaCour |
| 2002/0157068 A1 | 10/2002 | LaCour et al. |
| 2002/0160281 A1 | 10/2002 | Subramanian et al. |
| 2003/0018948 A1 | 1/2003 | Chang et al. |
| 2003/0023939 A1 | 1/2003 | Pierrat et al. |
| 2003/0126581 A1 * | 7/2003 | Pang et al. ............ 716/19 |
| 2003/0160980 A1 | 8/2003 | Olsson et al. |
| 2003/0165749 A1 | 9/2003 | Fritze et al. |
| 2003/0200523 A1 | 10/2003 | Takahashi et al. |
| 2004/0013952 A1 | 1/2004 | Elian et al. |
| 2004/0044984 A1 | 3/2004 | Keogan et al. |
| 2004/0067423 A1 | 4/2004 | Chen et al. |
| 2004/0107412 A1 | 6/2004 | Pack et al. |
| 2004/0133369 A1 | 7/2004 | Pack et al. |
| 2004/0172610 A1 * | 9/2004 | Liebmann et al. ............ 716/19 |

OTHER PUBLICATIONS

McCall, J. et al. "Integrated method of mask data checking and inspection data prep for manufacturable mask inspection: inspection rule violations" Proceedings of the SPIE—The International Society for Optical Engineering (Oct. 3, 2001) 4562:161-170.

International Search Report for PCT/US2003/021996 dated May 4, 2004.

Goering, R. "SEMI's Oasis provides respite from GDSII", *EE Times* Oct. 1, 2002.

Liebmann, L.W. et al., "TCAD Development for Lithography Resolution Enhancement", IBM Journal of Research and Development, vol. 45, No. 5, Sep. 2001.

Pack, R.C. et al., "GDS-3 Initiative: Advanced Design-through-Chip Infrastructure for Sub-Wavelength Technology", Proceedings of SPIE, vol. 4692, 2002, pp. 566-584.

Wong, Alfred K., "Resolution Enhancement Techniques in Optical Lithography", SPIE Press, 2001, Chapter 1.

* cited by examiner

METHOD AND SYSTEM FOR CONTEXT-SPECIFIC MASK WRITING

CROSS REFERENCED AND RELATED APPLICATIONS

This application is a continuation-in-part of co-pending U.S. application Ser. No. 10/620,285, filed Jul. 14, 2003, which claims the benefit of U.S. Provisional Application No. 60/395,415, filed Jul. 12, 2002. Both of these documents are hereby incorporated by reference in their entireties as if fully set forth herein.

BACKGROUND

1. Field of the Invention

The present invention relates to photomasks and photolithographic patterning in the production of integrated circuits.

2. Photolithography Background

Photolithography, is an optical printing and fabrication process by which features on a photomask are imaged and defined onto a photosensitive layer coating a substrate. The photomask may be used to generate the same master pattern on many locations on a given substrate as well as on many substrates. Photolithography and photomasks are critical to the efficient manufacture of integrated circuits (ICs) and to the progression of the IC industry.

A typical photolithography imaging system, often referred to as a 'stepper' or a 'scanner' in two common implementations, is used to project the image of the photomask onto the substrate. The substrates are typically, but not limited to, silicon wafers for integrated circuit (IC) manufacturing applications. The image from the mask and stepper exposes a photosensitive layer, or photoresist which, following development, results in a physical relief image in the photoresist. The resulting relief image is typically used as an in-situ mask itself by other subsequent fabrication processes to define the various individual material layers or regions comprising an IC through physical-chemical processes and actions such as etching, material deposition, or ion-implantation of dopants.

For IC fabrication applications, photomask features correspond to the various base physical IC elements which comprise functional circuit components such as transistors, and interconnect wires, contacts, and vias as well as other elements which are not functional circuit elements but are used to facilitate, enhance, or track various manufacturing processes.

Through sequential use of the various photomasks corresponding to a given IC in an IC fabrication process a large number of material layers of various shapes and thicknesses and with various conductive and insulating properties may be built up to form the overall integrated circuit. The photolithography process generally follows IC design and photomask fabrication.

IC Design

An IC design often requires an immense effort and highly specialized electronic design automation tools (EDA) such as from Cadence Design Systems, Inc. Design information generated by tools and designer activity is captured in files or databases and includes, depending upon the type of circuit; functional descriptions, electronic schematics, results of timing and power analyses, as well as the geometrical layout of the various features shapes comprising the IC. To facilitate design reuse and speed up the overall IC design cycle, typically pre-existing and pre-characterized circuit design component elements in the form of library cells, macro-cells, or blocks are often used. The IC physical design typically includes and describes each layer required to manufacture the IC in the fabrication facility (fab) using a photolithographic process.

For example a 'gate' layer is typically associated with the gate photomask and the photolithographic patterning (and subsequent pattern definition such as through reactive ion etching) of the polysilicon transistor gates. Similarly, a 'contact' or 'via' layer corresponds to a contact or via mask and typically corresponds to patterning the interconnect contacts with active transistors, metal wires, or other devices comprising the IC. An IC physical design may be comprised of more than 25 layers.

IC Design Database

Typically, design data exists in many separate files including physical, logical, and various functional data which are often unique to the individual design tool being used. For example, the physical design is often stored in a GDS-II stream formatted file. GDS-II is a file format which is classified as a "data interchange format," used for transferring mask-design data between the IC design and the fabrication facility. It is an EDA industry standard file format. The electronic network or schematic is often stored as a net list file. However there are many files for each of the diverse requirements of the design flow and often a number of the files are proprietary to one vendor and unusable by another vendor's tool. Recognizing this problem, the industry is making significant strides towards broad implementation of a consistent and standard open source database enabling the efficient storage, management, and dynamic access of IC design and manufacturing data as well as interoperability of design tools. An example is the OpenAccess database for design and the Universal Data Model (UDM) for manufacturing and the design-manufacturing interface.

Photomasks

Following IC design, photomasks (also referred to as reticles or simply 'masks') are created from the physical design or layout. The mask provides the master image of a specific layer of the physical layout, and as such, are critical to the lithography process. The accuracy with which masks are fabricated and the manner in which they are integrated with the design and lithographic system parameters greatly impacts the performance and yield of the resulting IC's manufactured.

Masks may be created by various processes. In one method, an electron beam system is used in a lithographic process to write the pattern onto a photoresist-coated glass mask substrate in accordance with mask data derived from a physical design layout. Optical laser-based systems, typically in the deep ultraviolet, are also used similarly. Following development of the exposed photoresist, the resulting relief mask is used as an in-situ mask for the etching of the chrome or other mask material resulting in an optical transmission mask usable in a photolithography system.

Today the features on the mask, when normalized to the reduction ratio of the projection lithography system, are often significantly smaller than the exposure illumination wavelength of the system. Imaging subwavelength features onto the substrate is a significant challenge even if various sophisticated resolution enhancement techniques are used. The result is in poor light/dark image contrast between the features desired to be printed and those that are not and distortion in the printed features in comparison to the designer's 'target layout.' Despite resolution enhancement efforts, distortions of the printed features may persist in comparison with the designer's desired target layout.

There are various and different types of masks and different styles of resolution enhancement technology (RET) techniques typically used to mitigate subwavelength effect distortions and to improve the resolved feature process latitude. Mask types include conventional chrome on glass masks, masks which additionally include phase shifting features, chromeless or phase only masks, and so on. RETs include attenuated phase-shifting masks (attPSM) and alternating aperture phase-shifting masks (altPSM), aggressive model-based simulation-driven optical proximity corrected (OPC) masks, rules-based OPC masks, scattering bar (or sub-resolution assist feature (SRAF), masks and so on. All RETs, in this sense, involve artificial optical enhancement features which are not a part of the physical circuit. The physics and action of the photolithographically printed enhanced resolution circuit features can be quite complex to non-specialists and is typically highly non-intuitive, particularly to non-lithographers. Furthermore, the proper application of RETs typically requires sophisticated optical models, large amounts of numerical simulation, and specialized personnel.

PSM masks typically require definition of multiple materials and a more complex manufacturing sequence than conventional chrome-on-glass (COG) mask technology. This involves a number of sequential mask writing and etch processes of each of the various materials/layers to the appropriate specification to achieve the required mask property. For example, for some alternating aperture PSM (altPSM) masks, not only is the chrome layer etched but the glass itself is etched to provide two or more different phase shifting regions. The chrome and phase shifting regions furthermore may exist in a number of configurations. In one configuration, shown later in the examples, the altPSM mask is a single exposure mask wherein the chrome is etched to provide an amplitude transmission mask and the glass is etched to specific depths to provide conjugate phase shifters. This configuration is not typically used however. In a more common configuration, the altPSM masking is performed using two masks and two exposures; a conventional chrome mask as well as a purely phase shifter mask used in two separate lithographic exposures of a common photoresist.

Masks are typically fabricated at a scale of up to 5× magnification of the final patterned image size and corresponding to the reduction ratio of the projection imaging system.

Photomask Data

In typical applications, the design layout data must be formatted appropriately for the mask fabrication equipment. The polygonal shapes of the design layout are typically fractured into a data set of simple base polygons appropriate for the mask writing equipment. These data typically reside in various files and are often specific to particular vendor equipment and may exist in proprietary vendor formats. These data files typically do not contain any design knowledge per se, but are primarily the aggregation of machine-oriented base polygons which comprise the mask layer and which correspond to the mask writer to be used.

Similarly, photomask inspection data resides in a different file formats however the data in effect comprises a template describing the acceptable shape including acceptable shape variations following mask fabrication. Typically the photomask data files can be huge, and the sheer volume of data and data transfer throughout the systems involved in mask fabrication can impact the available efficiencies of the mask fabrication cycle as the data are unordered and non-prioritized. One example of a photomask file format used for mask writing is MEBES, (Manufacturing Electron Beam Engraving System.)

Photomask Defects

Before being used in a photolithography system to replicate the mask image in reduced size onto a wafer when building the IC, the mask is inspected for defects. A defect is typically considered to be any deviation from the ideal physical layout defined by the IC designer outside of an acceptable margin or tolerance. Defects found in the mask will often be repaired so that they will not be replicated and introduce harmful distortions to the chips created from that mask. However defect repair is difficult and time consuming and indeed may even cause more harm than good due added and complex processing and handling. So it is important to waive defects if possible and to ascertain the repair costs of any perceived defects to ascertain whether the repair is worth it.

Some defects may be waived if the product engineer ascertains that impact is negligible. However determining a given defect's potential impact and criticality is often ambiguous or very time intensive. With the exception of gross defects, many defects are poorly correlated with a functional outcome.

Subwavelength lithography further complicates correlating defects with functional results. Since many features are inherently distorted, defect screening based upon traditional, rather simple, uniform 'visual' criteria is increasingly difficult. Furthermore the size of a defect on a photomask is not necessarily an indicator of the relative impact on the resulting silicon pattern due to the highly non-linear nature of subwavelength photolithography. Compounding this difficulty is the fact that the defect will impact various physical features of the same size and shape on the wafer very differently depending upon device or process context. For example, a given distortion of a shape used as a switching transistor gate may be unacceptable whereas the same distortion and shape in the context of a long interconnect may be wholly insignificant. The same can be said of other cases, for example, low-power versus high-speed transistors.

With current technology, IC photomask defect interpretation requires highly skilled multidisciplinary interpretation of the potential impact on the IC and attempts to waive defects based upon overly simplistic 'visual' metrics unrelated to specific device performance or yield. However, defect review is often ineffective and overly burdensome as the circuit context of the features impacted is typically not known and the interpretation of the resultant distortions on the final IC is often highly non-intuitive due to the increasingly complex non-linear lithography and device (or other) physics in-play.

Resolution enhancement technology (RET) features add to the difficulty as they are, at least in the case of OPC (optical proximity corrected), predistortions of the target layout designed to achieve the proper silicon pattern shape. These RET features may themselves be distorted due to the various limitations of the mask writing process including grid snapping and temporal or thermal variations. Under some circumstances of distortion, the RET feature may be worse than nothing at all. Similarly, some distortions sitting within a natural RET-like zone may conceivably even be beneficial. Therefore the simple visual metrics historically applied uniformly to all features have significant drawbacks.

The goal for mask writing is to pattern the photomask in a manner such that the features will be within acceptable distortion margins resulting in a photolithographically printed pattern that has sufficient fidelity across an acceptable process window and that achieves its respective functional purpose. Historically, the most sensitive features with the smallest margins have determined the margin for all features, although this is not efficient.

Resolution and RET

Due to fundamental inherent limitations in current and near-future optical lithography processes, the layout of the IC is no longer directly equivalent to the pattern printed on the eventual IC wafer. As a result, various RETs are used to compensate for various distortions, or to enable higher resolution, through advanced optical techniques. For background on RETs, see *Resolution Enhancement Techniques in Optical Lithography*, Chapter 1, by Alfred K. Wong, SPIE Press, 2001; and *TCAD Development for Lithography Resolution Enhancement*, L. W. Liebmann et al., IBM Journal of Research and Development, Vol. 45, No. 5, September 2001, both of which are incorporated herein by reference in their entirety. RETs are typically added just prior to tape out, and out of view of the designer.

RET features are often 'sub resolution features'. That is, they are so small in comparison with the lithography system wavelength that they are not singularly resolvable by themselves. These artificial non-printing features serve to improve the resolution and process window of the printing process and typically require a great deal of special care and interpretation when writing or inspecting a photo mask. Their action occurs through beneficial constructive interference with other features in close proximity. The impact of RET features on the fidelity of resolvable IC features is often highly disproportionate to their size.

Similarly, small sub resolution-size defects or positioning errors of circuit features may as well have disproportionately large impact; however the impact is destructive rather than beneficial. Either size or positioning errors may result in very large errors on the patterned substrate, necessitating that mask design and fabrication must be performed with sufficient precision. The "Mask Error Enhancement Factor", or MEEF, describes a multiplicative factor by which localized mask errors are effectively increased when the mask is printed onto the substrate. MEEF values may be large (>10) for some small features such as contacts or vias necessitating extremely accurate mask printing.

As a result, the patterned feature fidelity and dimensional accuracy are far more difficult to attain as compared to previous generations. These highly non-linear and non-intuitive effects are due to inherent 'Optical Proximity Effects' occurring between features in close proximity to one another. This exposes a significant problem impacting the IC industry.

Not only are the critical dimension feature geometries decreasing in size into deep sub-wavelength dimensions but they are also decreasing even faster than the venerated Moore's Law predicts. The already large number of these features is growing at a dramatic rate as well. Furthermore, due to the necessity to mitigate increasingly severe optical proximity effect distortions through resolution enhancement techniques at the mask level, the overall polygonal figure count is skyrocketing at a superlinear rate. As a result, this increased use of RETs dramatically complicates mask fabrication while increasing costs and other complexities.

These critical feature geometries are often written on the photomask with great precision due to circuit sensitivities. These include the sensitivities of performance, power, and other complex parametric and functional yield factors due to lithographic patterned feature dimensional variations. Many structures are extremely sensitive to small variations in the mask due to the severity of the non-linear imaging in this region. As previously discussed, even a moderate mask error enhancement factor, or MEEF, may cause a small error in the mask to be magnified disproportionately and often non-intuitively. This may result in circuit failure. Extreme accuracy may therefore be required. However, not all features have high MEEF and not all features have extreme fidelity needs to achieve the IC's design functional specifications. In fact many features are currently constructed and inspected to much higher accuracy specifications than are actually required, complicating mask fabrication and inspection unnecessarily. However, masks are typically written with uniformly high accuracy such that all features regardless of need or purpose are written with the same precision as those features that actually require the high precision.

These factors have led to increases in the time it takes to create masks, and in the number of errors impacting mask elements, and to the higher costs associated with sub wavelength mask process. Relatively few RET enhancement features are responsible for the great improvements that the technology provides. Many are overused and unneeded corrections and are often applied due to a lack of sophistication of the design, analysis, and fabrication tools currently in use. As a result, while RET is necessary, it can also be problematic needlessly increasing costs without desired functional improvements, and, when non-optimal, may even be responsible for decreasing yield.

Examples

Some of these difficulties may be described by example with respect to a traditional photolithography process, including mask creation and inspection methods, as shown in FIG. 1. At block 102 an integrated chip (IC) design is created, often by using various EDA systems.

The IC digital design flow typically starts with a detailed design specification and an abstract representation of the desired circuit and its operation. This may occur in the form of a computer-based schematic representation of functional units, a logical representation, or a high-level description language which conveys logic state at various times and conditions. Analysis is used at this level to validate that the circuit will perform within design specifications. This abstract description is cast into a physical description during layout synthesis and routing. Physical verification of the layout shapes and projected electrical function is then performed to validate that the physical representation does indeed correspond to the original schematic, or other, representation.

The design 102 often produces a set of circuit elements in a layout to effect a desired circuit electrical operation on a layer-by-layer basis. This is often referred to as the design flow. For background on IC design and mask manufacturing processes, see *Resolution Enhancement Techniques in Optical Lithography*, Chapter 1, by Alfred K. Wong, SPIE Press, 2001, which is incorporated by reference in its entirety.

Up until tape out or when the design is ready to be handed-off to mask fabrication and manufacturing, a vast amount of information is available including, for example:

the relation of the physical layout features to the design schematic or netlist;

individual circuit element models such as BSIM3 models for Spice circuit simulation, parasitic extraction data and TCAD-driven model parameters describing detailed properties of various devices and circuits;

various circuit networks of the circuit which may have critical properties such as critical timing or power nets; manufacturing assumptions which were used in the IC design.

Furthermore, much of this information is typically organized into a design hierarchy and includes libraries of base cells and other 'hard IP,' of pre-designed and pre-characterized blocks.

Tape out of the 'GDS-II' layout is typically the last step of 102, and is the hand-off mechanism to manufacturing. Physical circuit elements at the 'tape out' level may include, for example, transistors, power buses, resistors, capacitors, and interconnects. However other, necessary but non-circuit, elements may also be included. These include features with various purposes such as descriptive logos to be printed on the IC substrate, non-printing RETs, as well as other printed manufacturing elements such as area fill or slotting features used to respectively improve layer planarity or mitigate the impact of interlayer stresses resulting from dissimilar materials and thermal processing.

However, typically tape out produces a geometries-only design hierarchical data file in GDS-II stream format. The wealth of functional circuit and other design knowledge is eliminated in this step and therefore is unavailable to any data file derived from it or any design, manufacturing, or manufacturing integration activity occurring thereafter.

Process 104 prepares the mask data and creates a job deck. This starts the mask flow, which runs through mask inspection and repair. Knowledge of the mask writing process, and to some extent the photolithography process, may be employed in 'fracturing' the GDS-II design during mask data preparation. At 'fracturing,' the mask data is prepared for the mask writing equipment by breaking complex polygonal shapes into a simple base set of shapes and by applying mask writer, electron- or laser-spot proximity effect shape, exposure compensation as well as performing biasing, registration mark inserting and other required operations.

Typically, the mask data is prepared into a MEBES, or other low-level machine-specific data file format. The MEBES file holds polygon and geometry information to be used in writing, but like the GDS-II stream file, it holds none of the higher-level IC design or circuit feature functionality or criticality information available in the IC design flow.

There is no 'knowledge' of what a feature is beyond its geometry and location. In other words, there is no annotation or linkage to the functional intent of the geometrical feature. Conventionally, very little design from the standpoint of physical layout modification is done at block 104, as the IC design flow sets the layout and often most of the RET and other manufacturing enhancements.

Process 106 writes the mask. Mask writing often involves writing the polygonal shapes and layout of a mask design pattern (from the MEBES file, for example) in a photo- or electron-sensitive coating (often called a "resist") on a mask substrate (often glass) and then etching in chrome, glass or other materials associated with the specific mask technology being employed (for example CoG, attPSM, altPSM). Mask writing may be based on various technologies, including either electron beam-based or laser-based systems. The fidelity of a mask element written on a mask substrate may be defined by the beam exposure intensity, shaped-beam aperture employed, scan or vector rate, and by the adjacency of other features due to laser, electron, or thermo-chemical proximity effects on the mask. Beneficial effects which may result from additional care such as from increasing the write time with reduced write energy may be offset by the negative effects resulting from thermal and chemical changes in the photoresist caused by other writing events as well as errors due to mechanical or environmental instabilities which occur over longer times. As such, there may be a tradeoff between optimizing writing speed and accuracy.

A mask writing system may be provided with, and controlled by, a database containing the mask's polygonal shape and layout information, such as the mask information in the MEBES data file. However, the design data and 'design intent' information usually are not available since it resides in a different database, from which only the geometry information was copied. Design data includes data relating to the electrical net list or schematic, functional intent, and criticality of the various IC circuits and physical elements. Thus, the writing tool only receives simple polygonal shapes and location data. There is no knowledge of the design intention of a given polygon, nor a mechanism for establishing the requisite relationship in order to perform design-aware manufacturing information processing activities capable of enabling the more intelligent mask writing or inspection activities.

In such systems, from this point on, the imaging operations of mask writing and inspection operate under uniform and isotropic imaging assumptions. That is, all features are considered with equal severity and processed under the same conditions as their neighbors, and they are assumed to be spatially and rotationally invariant as well as device- and circuit-unaware. Thus, the polygonal shapes across the mask, regardless of function or real criticality, are treated equally in terms of their importance to the influence on the performance of the resulting circuit.

In continuing reference to the example of a traditional photolithography process as shown in FIG. 1, after mask writing, a mask inspection process 108 is performed. A mask that has been written or printed with polygonal mask elements is inspected for defects. Such inspection often includes comparing a written mask against a reference version of the mask as defined by its mask design database. Defects may include any departures from the reference mask design such as: distortions; missing, misaligned or misshapen shapes; as well as pinholes, bridging features, or holes.

Defects in a mask have generally been assumed to result in defects on the silicon wafer and functional failure in an integrated circuit replicated from that mask. The mask inspection process 108 references only the polygonal shape and layout information from a mask data file 104 generated by the fracturing tool, which is often in a file format such as, for example, Klaris (an abbreviation for KLA-Tencor Reticle Inspection System, produced by KLA-Tencor, Inc. of San Jose, Calif.). Little information relating to the function or relative importance or criticality of individual mask elements can be elicited from the information at hand and from comparing a mask to its mask design template. As a result, each mask element is inspected more-or-less equally in terms of the time and resolution of the inspection system, regardless of its relative importance to the operation of the resulting circuit.

Typically, deviations from the ideal are considered defects. Each found defect is examined, 112, to determine if it can be repaired. If the defect is unrepeatable, an analysis is performed to determine whether it may be accepted without repair. This decision may require advanced modeling and simulation of the defect under the specific lithography process being employed. An "unrepairable defect" might be a defect that cannot be cost-effectively fixed by repair processes such as focused ion-milling or equivalent deposition repair techniques, for example.

An unrepairable defect requires the mask to be discarded and a new mask writing process, 116, to be performed. For example, a mask repair performed by ion beam milling or other processing may be more time-consuming and expensive than writing a new mask. Additionally, mask correction often creates further defects in a mask, as it may add unwanted material during the ion milling process or alternatively may erode the mask elements in some unwanted manner. Merely handling the mask may alter or damage it through any number of means, including electrostatic discharge (ESD). As the costs of mask sets increase into the multi-millions, it is prudent to consider the overall cost, risk, and benefit tradeoffs. At repair block 114, a mask repair process fixes the defect. Mask defect repair often involves focused ion beam (FIB) repair. After the mask correction is performed, the mask inspection process 108 is performed again to find any new defects which may have been introduced during the repair process. Such a cycle is often costly and time-consuming. Once a written mask is found to have either no defects or an acceptable number and type of defects during analysis 110, the integrated chip is created, 118.

During the photolithography process 118, the mask is used to transfer the mask pattern to a wafer. The mask allows light to pass through transparent sections defined by the polygonal mask elements previously written or etched thereon. An image of the mask so produced is then passed through an imaging system often at a reduced image size, and replicated on a wafer surface through the lithography process to create the integrated circuit. Thus, the mask plays a critical role in transmitting the circuit design to the wafer surface.

Despite the amount of care and expense focused on the manufacture of the photomask inherent printing distortions are inevitable due to the nature of subwavelength, or low-k1 lithography. Therefore, there is a need to understand the impact of distortions on the resulting circuit performance. Not all distorted features are damaging to the function of the circuit and application of extreme measures in writing and inspection may be largely ineffective, time consuming and highly costly.

For sub wavelength IC manufacturing the goal is not only to achieve proper circuit function across a practical manufacturing process window despite inherent visual patterning distortions, but to do so with acceptable functional and parametric yield, and within acceptable cost, risk, and schedule constraints. The technique discussed here provides one means in a comprehensive mask and design-aware manufacturing scheme for maximizing the performance and cost effectiveness of sub wavelength mask fabrication through design-awareness.

SUMMARY OF THE INVENTION

A method for generating lithography masks includes generating integrated circuit design data and using context information from the integrated circuit design data to write a mask.

As will be made apparent to those skilled in the art, other and further aspects and advantages of the present invention will appear hereafter.

BRIEF DESCRIPTION OF THE FIGURES

Embodiments of the present invention will be described with reference to the following figures.

DETAILED DESCRIPTION

Figure 1:
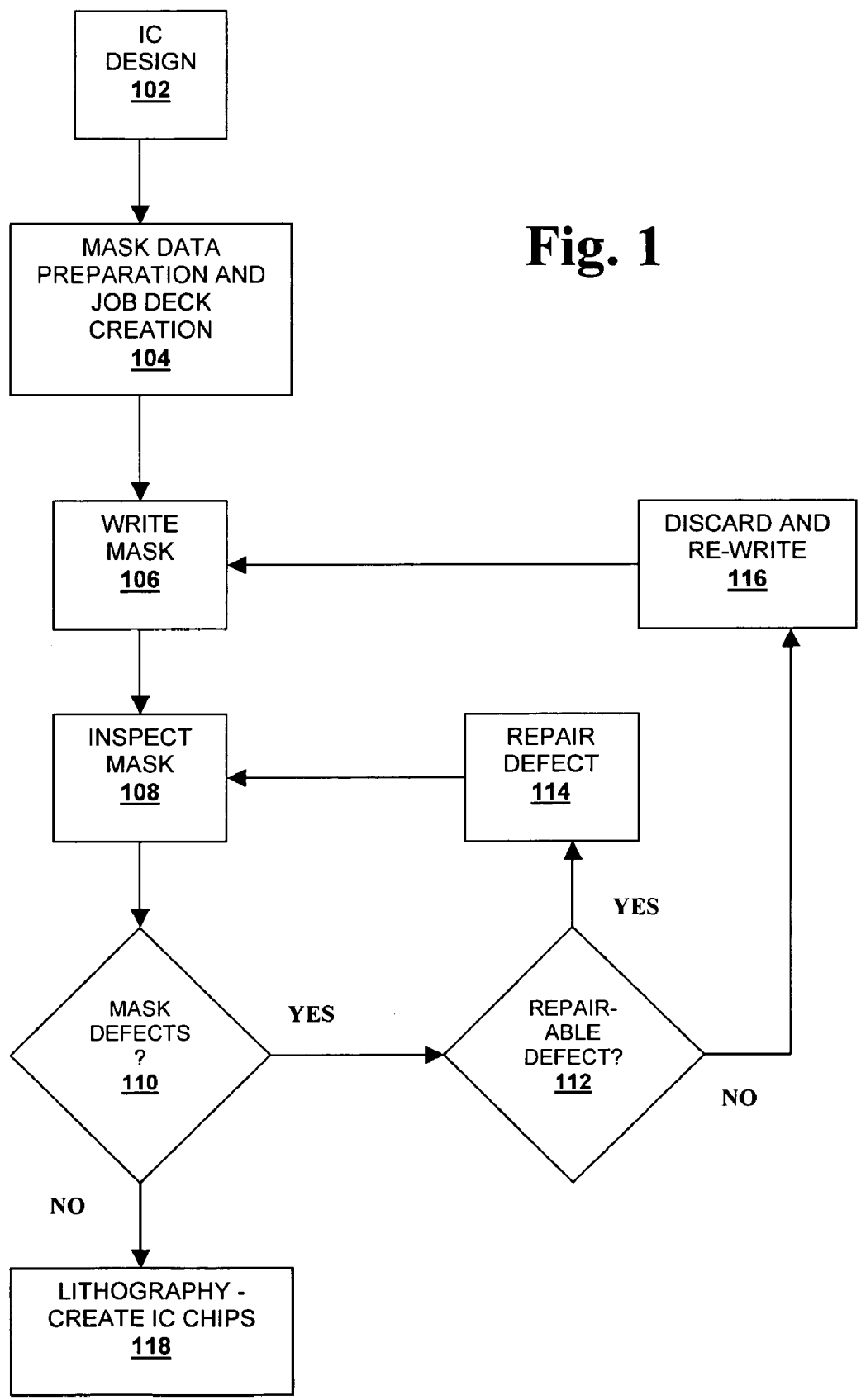
FIG. 1 is a flowchart view of an integrated chip design and manufacturing process.

This disclosure details a new systems and methodologies to enable far more efficient and cost-effective mask writing processes than currently available. For purposes of this disclosure "mask writing" includes all types of manufacturing equipment which utilize or may utilize IC design information during their manufacturing process, such as electron or laser-based mask writers, maskless lithography systems, as well as ion-based delivery systems utilized to repair masks by 'writing' energetic ions to erode unwanted materials or deposit wanted materials in a physical design, This result is achieved by utilizing a-priori contextual knowledge relevant to the function and manufacturing limitations of integrated circuits to inherently speed up the mask writing process by writing the mask at just the appropriate resolution required, neither greater nor lesser, to achieve the design functional requirements.

Mask writing at just the appropriate resolution means mask writing productivities are significantly improved, usable physical circuit feature fidelity and process window are improved, and design specification outcomes such as: high performance, low power, high-yield, or critical functional tolerances are achieved. Time is saved and machine resources are used efficiently by enabling and utilizing an approach which focuses resources on elements according to the context of the element, the criticality of circuit or manufacturing function of the element, and the consequences of patterning distortions for the element.

This approach is important since the level of overall information density and complexity of IC's and masks is increasing at a superlinear rate and is far exceeding the computational capabilities and practical affordability of the massively parallel computer-based systems being utilized for such applications thus contributing to the rapidly rising cost and risk of photomasks and IC fabrication. Utilizing IC design knowledge is the key to enabling these new manufacturing efficiencies. The a-priori knowledge and information of the IC design in the design database enables two highly valuable approaches to be employed for improved efficiencies in mask manufacture; (1) contextual interpretation of impact of mask errors through modeling and simulation of the key operative limiting physical effects as well as circuit simulation and (2) 'divide and conquer,' partitioning of the problem into high-resolution and low resolution regions.

Simulation driven modeling of the key operative physics is necessary due to the complex and highly non-linear nature of the phenomena responsible for IC manufacturing functional yield and parametric variations due to mask defects. It provides an accurate estimation of these consequences of specific mask distortions/defects if they were to be printed in the case of mask writing or waived in the case of mask inspection. Computational resources, models, and simulation tools for performing these types of simulations have been proven in the TCAD industry and are capable and practical. Divide-and-conquer methods enable the overall image, to be written or inspected, to be partitioned into high and low resolution regions based upon functional as well as practical manufacturing attributes. Doing so is highly beneficial due to the very large information density of images at the mask and wafer level for subwavelength lithography. The large information density ca be caused by very large pixel data volumes.

The methodology presented here enables new cost-reduction mechanisms in the most costly and risky areas of integrated circuit fabrication. Furthermore, the methodology presented here is applicable to current mask writing and inspection systems used by major IC fabrication facilities worldwide, potentially enabling some existing equipment to be usable for a longer lifespan.

A method and system are provided for improving mask writing processes. In an embodiment, various key information elements including electronic properties, physical geometries, and manufacturing information used in designing and characterizing the operating properties of an integrated circuit, as well as the photomask to create it, are used to give unique context to the various polygonal shapes being written on a mask. The polygonal shapes of various circuit elements can then be written to a mask in a desired spatial design, using the contextual information. The contextual information may be added or emphasized for use in guiding a mask writing process. The contextual information may include manufacturing and circuit context parameters, as well as information used by processes that prioritize and order various features.

Contextual information related to manufacturing may include, for example: specified resolution, criticality, additional proximity-effect distortions which may not have been accounted for or previously associated with a given mask feature, topological properties of a circuit layer resulting from mask features, associated chemical or thermal limitations, or any specified weight factors, criticality or region-based prioritization which may be beneficial for production quality and efficiencies. Contextual information related to the circuit may include, for example: associations with and feature properties of an element in the circuit (e.g. MOSFET or interconnect elements), priority criteria for the element relative to other such elements, or critical tolerances. Each mask element may then be created in the context of its individual parameters, rank, or order. Therefore, each mask element may receive an amount of mask writing system time, energy, order and resolution (such as with a shaped-beam writing system) that is commensurate with its mask-specific context.

In one embodiment, a process is provided whereby chip and mask design information to be used throughout a mask writing process is enhanced or re-ordered. This information may include context and priority information for each element of a mask, and be used to efficiently allocate the resources of a mask writing system. For example, each mask element could be written by the system with an amount of energy, time, and cost commensurate with its context, priority, or ranking relative to other mask elements.

A context specific mask writing process may be used in single-pass or multipass writing, maskless writing, and other controlled-beam writing processes. Context specific mask writing is material and fabrication technology independent and includes for example, silicon, silicon-on-insulator, silicon-germanium and others, as well as other technologies which utilize mask writing or direct write in their manufacture. The contexts which guide the sophistication of mask writing operation and its precision are specific to the mask elements and will change according to the severity and impact dictated by the principle operative physics phenomenon at play in both the functioning device that the mask element is associated with as well as the processes used to fabricate it.

Figure 2:
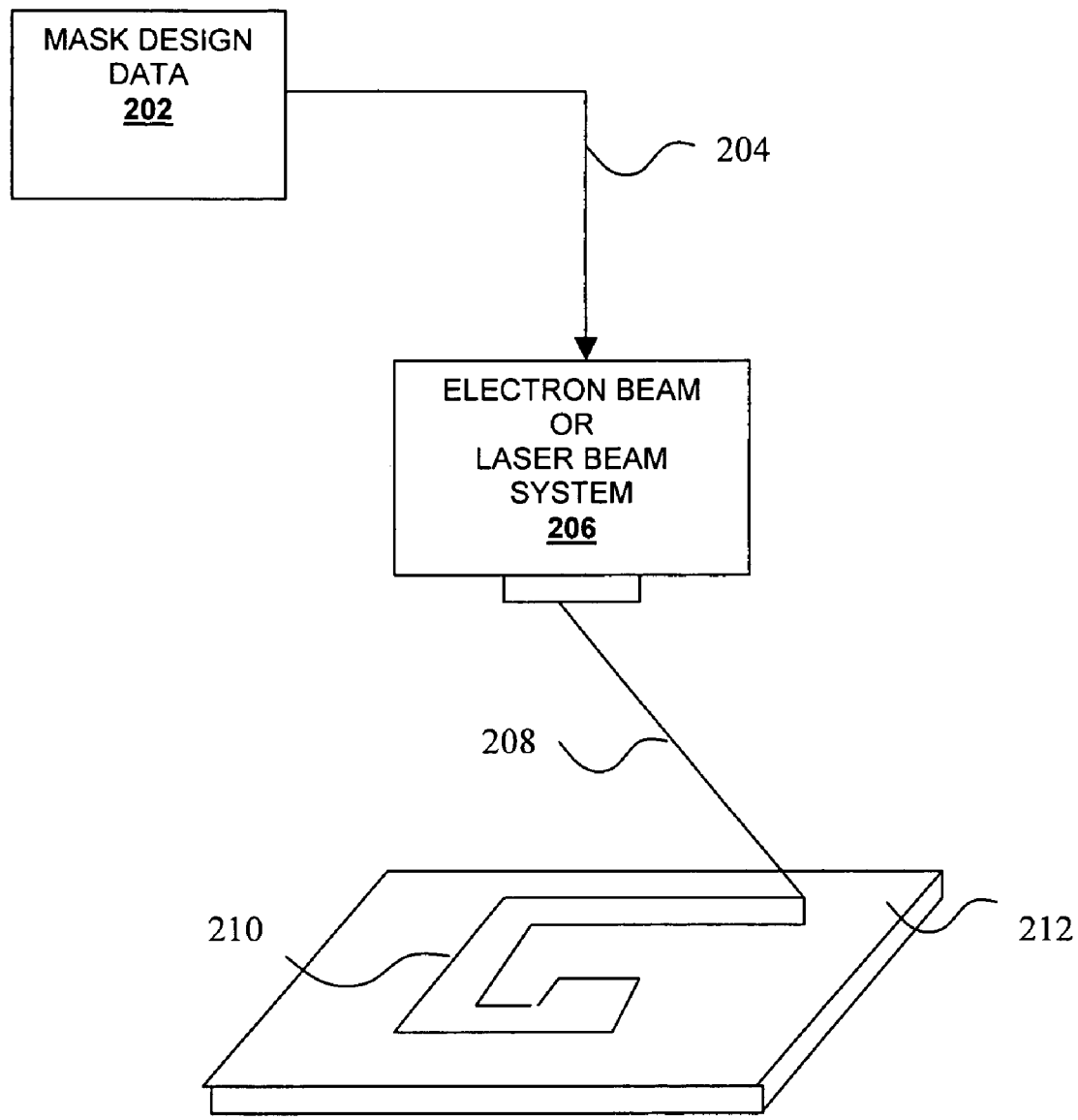
FIG. 2 is a schematic view of a mask writing system according to an embodiment of context-specific mask writing.

FIG. 2 represents a mask writing system according to an embodiment of context-specific mask writing. The system may include electron beam, ion beam, optical beam, x-ray-based writing or imaging tools. Mask design data 202 may be provided to a mask writing system 206, via data storage devices or other data transfer methods 204, such as file transfer protocol (ftp) over an internet connection for example. Mask design data 202 is maintained on a computer readable medium, such as a hard disk or other computer storage media. The data may be a part of a design database such as the UDM and OpenAccess. The mask design data 202 may be used to define, for example, the cross-sectional shape of the writing beam, or the order, energy level or speed of traverse of the electron or laser beam 208, in order to produce polygonal elements in a desired layout on a mask surface 212.

As an illustrative example, the sample shape 210 may be defined in an IC design database by various parameters, including dimensions, shape, orientation, location on the mask, priority, criticality, its relationships to other features with which it forms a device component such as a MOSFET, CMOS inverter in a hierarchy of physical features including library cells, macrocells, and so on. The IC design data in an embodiment of context specific mask writing includes contextual information such as, for example, mask priority, circuit function and criticality (such as critical networks, critical cells, or even critical devices), in addition to the polygonal shapes and location information found in conventional mask writing files, such as MEBES files. This and other similar additional information may also exist in a single DB as envisioned in GDS-3 or the OpenAccess Database Universal Data Model (UDM).

Embodiments of context specific mask or maskless writing may be applied effectively to various writing systems, including those utilizing either raster-scan and vector-scan techniques.

For example, a raster-scanning technique may be used such that an electron beam 208 is scanned across a mask surface 212, such as a moving glass photomask. In such a system, the beam 208 is then turned on and off to create polygonal shapes 210 on a pixel-by-pixel basis. Vector-scan techniques may use a more varied track of the beam 208 across a mask 212 to draw shapes. In either of the two approaches, the electron beam or laser-beam intensity level may be changed on a pixel-by-pixel or vector basis, respectively, to account for localized mask making requirements such as electron or laser proximity effects.

In an embodiment of context specific mask writing, contextual information for individual mask elements, such as relative importance and function, may be provided to the writing system to allow more efficient control of the writing beam 208. The writing system may then optimize the impact of the writing beam on the resulting IC by altering the beam's intensity, shape, and spatial and temporal movement based on the contextual information, such as individual circuit element functionality and criticality for example. Both raster-scan and vector-scan based systems can use the contextual information to provide more rapid mask writing by allowing individual mask elements to be written with varying precision and energy depending on their relative importance and function.

In an embodiment applied to multipass writing, substantial improvements in write time may be achieved by focusing the writing system's resolution and time on features which can benefit from such attention, and by avoiding undue attention to those features which receive little or no such benefit. This may be done by focusing the number of multipasses to those features that have contextual information indicating such benefit. Thus, with context specific mask writing, multipass writing (which is typically slower but more accurate) can be reserved for those features that derive the maximum benefit from it.

In one embodiment, a mask writer with IC design feed forward capabilities or "Design Aware Manufacturing" has contextual data describing hierarchies of criticality, and is therefore able to rank a feature list and adjust the beam size of the shaped beam mask writer accordingly. Data ordering within the mask design database based on a write queuing order is also possible, and may provide significant efficiencies over unordered mask databases, such as occurs with current MEBES files. This ordering can allow writing of the critical transistors and nets of an IC design, consistent with each feature's impact on the eventual product. A critical transistor or net might be written with the 'fine nib' at a time, order, and rate which allows a well-controlled photoresist thermal-and-photo-chemical equilibrium state to be achieved. This approach would allow a relatively unimportant geometry, such as an area fill cell, to be written with less precision than the critical networks of the IC.

An embodiment of the system may also prevent a logo from being considered just as carefully as the most critical cell of what may be a company's most important IC product since a logo is a visual element only and does not contribute to the functionality of the circuit. A hierarchy of feature importance and criticality may be ascertained on the basis of eventual circuit performance and manufacturing goals, thereby allowing a performance-yield writing strategy to be implemented. Additionally, estimates of process effects and circuit impact may be made based upon feature criticality, so that the beam order, shape, scan, and/or timing can be adjusted accordingly.

Figure 3:
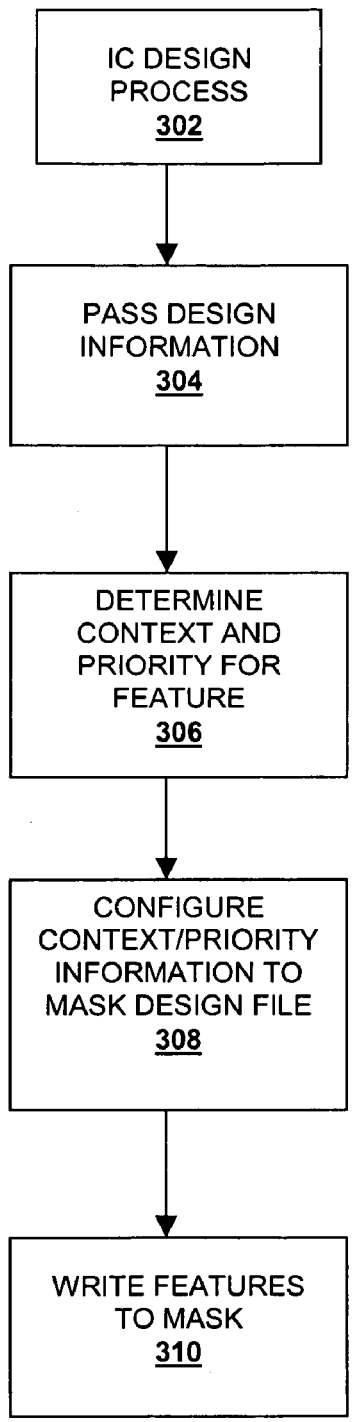
FIG. 3 is a flowchart view of an embodiment of a context-specific mask writing process for mask writing.

FIG. 3 illustrates a mask writing process according to an embodiment of context-specific mask writing. At block 302, an integrated circuit design process, or IC design flow, may include circuit design and analysis, layout synthesis and routing, verification, RET, and tape out. This produces an IC design database or data file in a manner which includes polygonal and location information, and also circuit and manufacturing contextual information.

At block 304, IC design information and contextual information may be provided to a mask design process. The contextual information of an IC design, including layout geometry data as well as circuit functionality and criticality information may be captured in a mask design database. For example, the design and contextual information, stored in an OpenAccess format and maintained on a computer readable media such as a hard disk or other various storage media, may be transmitted via file transfer protocol (ftp) or other internet protocol.

At block 306, a context and priority analysis may be applied. For example, individual mask elements and their design data may be examined in relation to the operative physics of the mask and wafer lithography processes in which they may be used and in the context of the integrated circuit elements they are intended to produce on a chip wafer. Such parameters as the function of a resulting circuit element, the criticality of that function to the operation of the circuit, and the priority or importance of the mask feature relative to other features on the mask, among other varied parameters, may be included in such a contextual examination of individual mask elements. Criticality may include such information as the impact of a predicted or potential defect on or near a mask element, while priority may include an indication that a mask element should be written in a certain order or at the same time as another element, such as in the case of matched transistor elements.

In an embodiment, mask manufacturing priority information may be determined for the mask elements either manually (via user interface, for example) or via automated or computer-aided method. For example, this may be done through a combination of automated, computer-aided, and manual tools. These tools may include critical net timing and/or signal integrity analysis and various design-for-manufacturing analysis. Determining priority, in block 306 may also include determining the ensemble of critical nets which, across a process window or spanning a range of field dependent lithographic lens aberration conditions, will impact the overall IC product's yield at the specified performance target. In an embodiment, this information, as well as other a-priori design knowledge, is passed to the manufacturing process. For example, the mask writing, mask and IC inspection, mask repair, and mask and silicon metrology processes may obtain the context and priority information.

In another embodiment, various other semi-automated or manual tools drawn from a toolkit of simulation, analysis, and database access and mining tools may be used which allow regions, cells, blocks or other specific geometric elements to be tagged on the basis of manufacturing needs, historical manufacturing learning and statistical metrology, device physics requirements, and system uncertainties, among others. These tags may travel down stream in the mask flow and remain available throughout to give context to more efficient and intelligent processes, such as mask writing, mask inspection, and metrology processes, for example.

An embodiment of either a manual or automated prioritization analysis in block 306 may include a set of criteria, or thresholds, by which mask elements may be categorized or prioritized based on features such as their context, function, or criticality, for example. Such criteria or thresholds may include or be based on: critical timing nets; critical regions, blocks, or cells; less critical regions, blocks or cells, such as a logo or area fill cells; associations, such as matched transistor pairs; and location criticality, such as crossing of raster stripes.

At block 308, a process for appending, or re-ordering, mask design data may be performed, in addition to mask data preparation and job deck creation. For example, data may be added to or configured in a mask design database to reflect the context and priority of individual mask elements. Mask design data may be configured to emphasize the context and priority of individual mask elements in the mask design, or in a manufacturing plan for the mask. For example, such enhanced data may include: a manufacturing priority and writing order for each element, information regarding elements that should be matched and manufactured in a temporally contiguous manner (such as matched transistors or sense amplifiers in DRAMs) a precision for each element, and indicators showing which features are functional circuit elements and which are optical or topography enhancement features. In an embodiment, a mask may be designed in blocks 304 through 308 based on a desired integrated circuit knowledge of the optical and physical effects of a lithography process imaging the mask to the wafer surface, and knowledge of device and interconnect physics. The IC design may produce a database or data file which may include such information related to each mask element, sets of elements, or areas of elements such as; dimension, shape, location, priority and circuit function criticality, in contrast to conventional systems.

Additionally, the mask design may account for the contexts of both the mask writing equipment and process, as well as the operative physics of the functioning circuit element and its relative importance and impact on the final product. For example, an area fill cell's purpose may be to help planarize the IC surface. The operative physics may indicate that feature is highly insensitive to any practical impact on the overall functioning circuit to be fabricated due to the type and range of interaction with other features. That is relatively large distortions are unlikely to impact the planarization process as the response to even relatively large inserted features have a range of effect on order of a large number of lithographic critical feature dimensions. The impact on the circuit may be low, except perhaps for relatively small effects of capacitive parasitic coupling, where the area fill cell is within a certain distance of critical interconnects either adjacent on the same layer or on other layers of the IC. An a-priori decision can be made automatically to set data tags associated with the figures describing these contexts and criticalities in the mask database, thereby allowing the writing or inspection strategy to adjust system resolution and processing accordingly.

With this, a mask design process can re-order the database in light of that contextual information prior to mask data preparation, job deck creation, and fracturing of the data for use by the writing tool. Additionally, such contextual data would be maintained in a data file for use throughout and further down the mask flow, including inspection and beyond.

At block 310, mask design features may be written to the mask substrate. For example, as shown in FIG. 2, mask design data in a database or set of data files 202 may be passed through a network connection, 204, to a mask writing system 206 that controls a writing beam. Such mask design databases or files may be in various formats, including OpenAccess, for example. An expanded and enhanced mask design database may be provided to a mask writing process 310 in FIG. 3 for use in applying a writing beam more efficiently in the manufacturing and functional context of an individual element being written. The mask writing block 310 may include using an enhanced mask design database to direct a writing beam so as to minimize the time and energy of the beam on each mask element in a prioritized order in accordance with the context and priority of that element.

An alternative embodiment may include further analysis and methods for applying mask design contextual information to the determination of which mask elements should receive various manufacturing, resolution or mask enhancements, such as Optical Proximity Correction (OPC), Phase Shift Masks (PSM) shifter insertion, area fill cells, or laser- or electron-proximity correction. Such a process for adding manufacturing enhancement features to mask elements may be applied to the mask design.

The following is an illustrative example of an embodiment including such a manufacturing enhancement analysis, which may include manual or automated prioritization of individual mask elements to determine which require such manufacturing enhancements. An automated version of the process may include, for example, a computer system and software program applying predetermined criteria to individual mask elements, as well as simulations of enhancements and IC effects.

Such determination may be based on such factors as: critical timing nets; critical power nets, critical circuit functioning of individual regions, blocks, or cells; less critical regions, blocks or cells, such as a logo or area fill cells; associations, such as matched transistor pairs; and location criticality, for example crossing of raster stripes. These factors may be pre-determined, or determined by an analysis of the internal parameters of the mask design. For various reasons, many mask elements may not require such enhancements. As one example of such an element often not requiring RET is an area fill cell, because its purpose is to fill space and its fidelity rarely impacts that purpose.

Decisions on the application of these various techniques may also be informed by and benefit from the contextual design information made available according to an embodiment of the context specific manufacturing system. Such design feed forward may allow engineers closer to the manufacturing process to use the context data to more efficiently apply manufacturing or RET enhancements.

Figure 4:
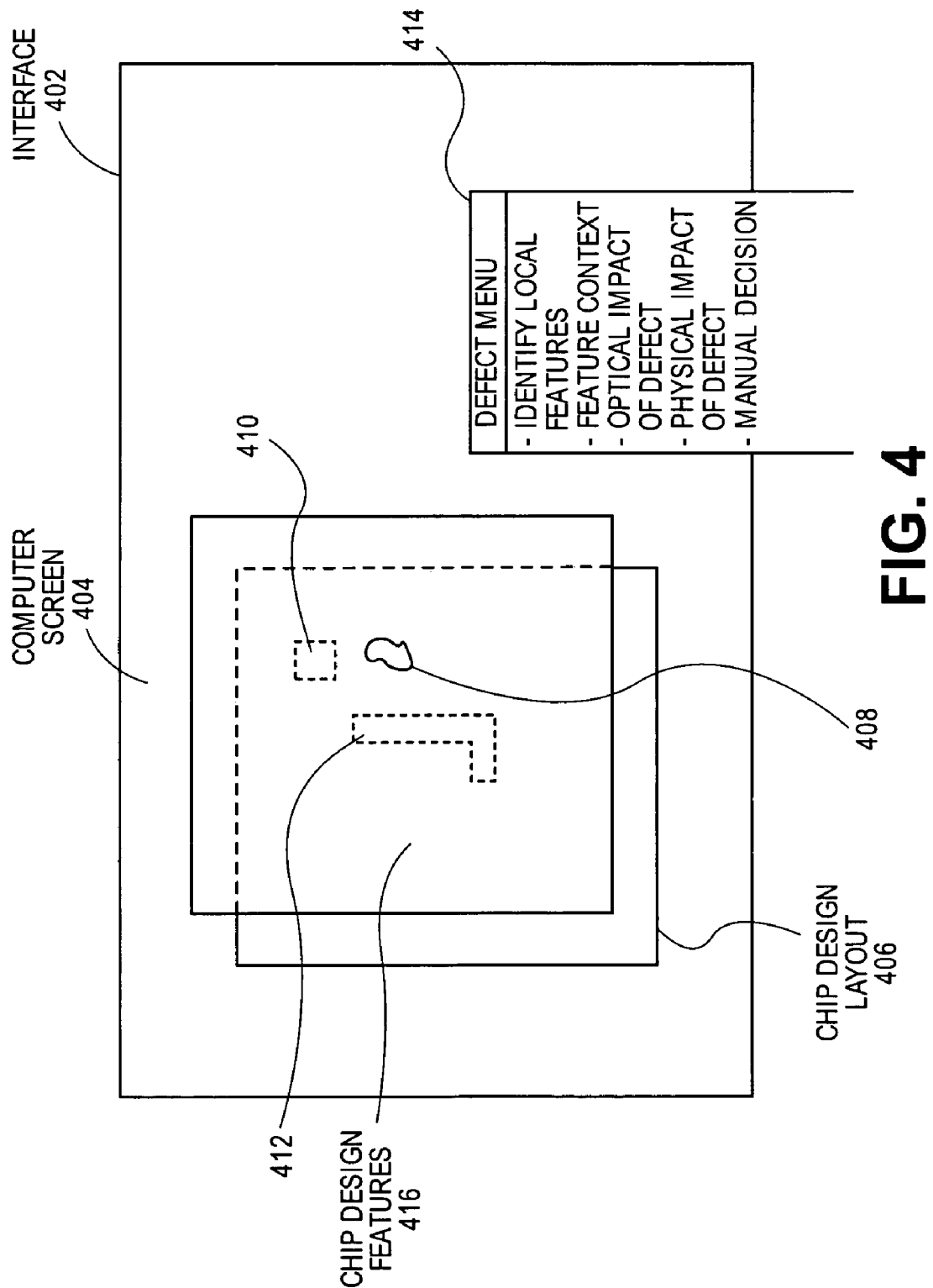
FIG. 4 illustrates an example of a user interface screen in an embodiment of context-specific mask writing.

FIG. 4 illustrates an example of a user interface to be used in an embodiment of the context specific mask writing system. Some embodiments may include a representation of the design layout using a design/mask layout viewer and editor such as embodied in the 'Virtuoso' tool from Cadence Design Systems, Inc. Through this interface the user may view the various mask and defect features in relationship to various mask writer or inspection system parameters, such as the write grid, as well as in the contexts of the electrical and process parameters of the circuit. For example, the tool and interface allows the mask layer of interest to be viewed in relationship to any or all of the other layers or features which comprise a functional physical device as well as in its relationship to the abstract device, or schematic component, and its use in the overall circuit (i.e. the schematic or the netlist.) Furthermore the physical geometry relationships to critical circuit networks enable viewing and highlighting of those features as well as tagging for simulation.

FIG. 4 includes a computer and database system, where the database includes design and fabrication data such as implemented in OpenAccess and the Universal Data Model.

Computer screen, 404, and data visualization and analysis platform such as Cadence Virtuoso, are used as an interface 402 to interact with the computer and database system. The platform may also include an IC chip view with physical layout, 406, and/or mask layout and defect overlays, 416. Defect geometries 408 may be shown on defect overlays 416. IC or mask physical layout 410 and 412 may also be shown on chip design layout 406. A menu for invoking simulation, analysis, database access, and other actions is shown in feature 414.

Simulation and analysis capabilities of the computer and database system may include the following: physics-based mask and lithography simulation capabilities to enable accurate prediction of the resulting pattern of the mask on the wafer throughout a range of typical key process variables such as defocus, energy, and field-dependent aberrations; empirical and physics-model based device simulation capabilities to enable accurate prediction of device properties under the influence of lithographic distortions throughout the range of process variables; simulation of the impact on circuit performance under the range of process variables; or random variations and dithering to anticipate the real impact of MEEF, and comparison against a-priori data.

The mask features, 412 and 410, or defects 408, may also be dithered for manufacturing analysis based upon structured experimental design techniques or through access to a metrology and inspection database of similar structures. Alternatively, known statistical distributions of defects or correlated distributions of defects with features or feature relationships or proximity may be imposed to enable rapid analysis of what-if scenarios. Pull down menus may be used to facilitate simulation planning, database acquisition, viewing of simulation results, design and mask database acquisition, cost-risk analysis, and adding or editing mask database entries. Graphical and printed reports capabilities may also exist.

An embodiment of this interface may include a menu to be used manually with each mask element to offer a system user various options in examining potential mask defects and their effects on the resulting circuit, such as: identifying adjacent circuit features, obtaining context and priority data for adjacent circuit features from the mask design or IC design databases, evaluating likely optical distortions caused by the defect, evaluating the physical impact of the defect on the topology of the resultant circuit level, or other actions to be done manually in examining and addressing the defect.

This may allow further evaluation of circuit and mask tolerances, likely defect scenarios, and the application of RET and other manufacturing enhancement technologies according to the context of the various mask elements. Such an interface offers a mask designer or mask writing system operator the ability to efficiently evaluate the mask design and its projected resultant circuit within the full context of the associated circuit, process and mask design databases. This may avoid expensive mask writing and correction.

ILLUSTRATIVE EXAMPLES

Figure 5A:
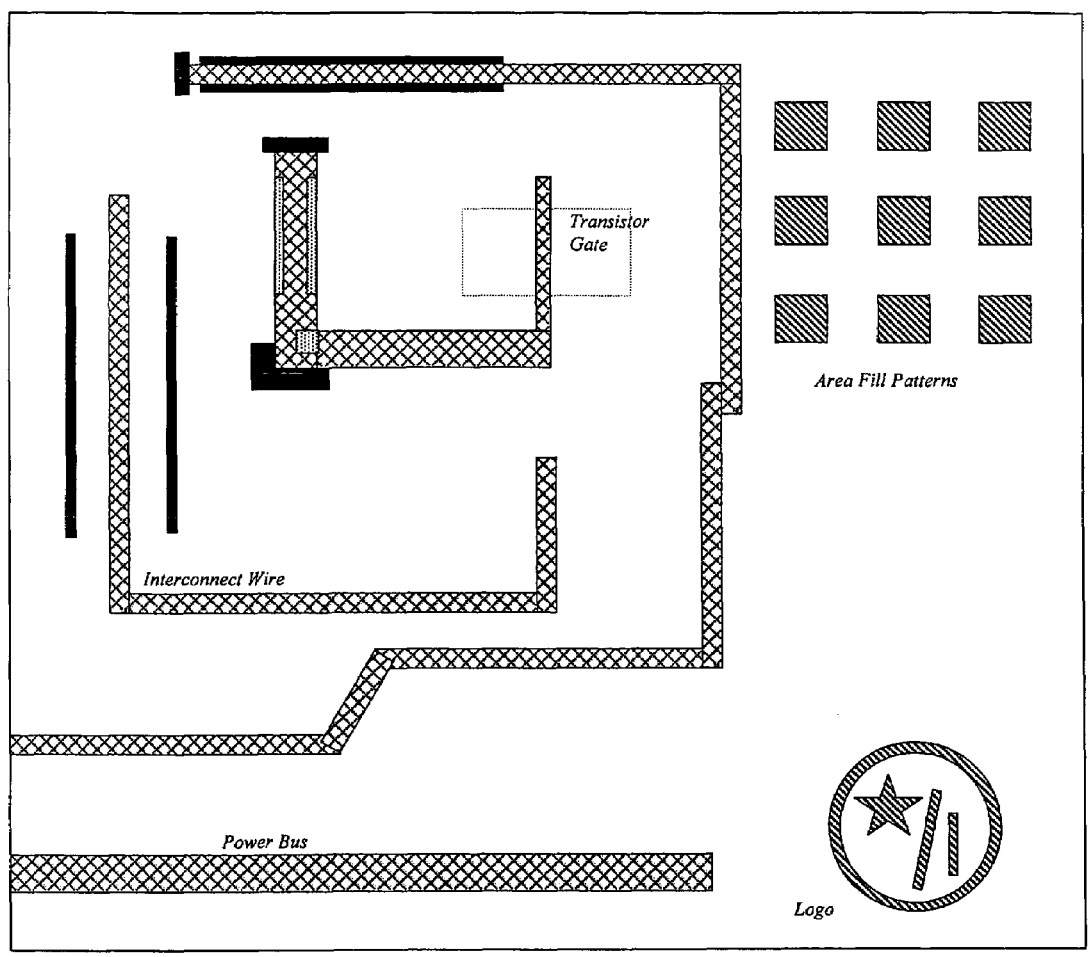
FIG. 5A illustrates the general types of features of a IC mask.
Figure 5B:
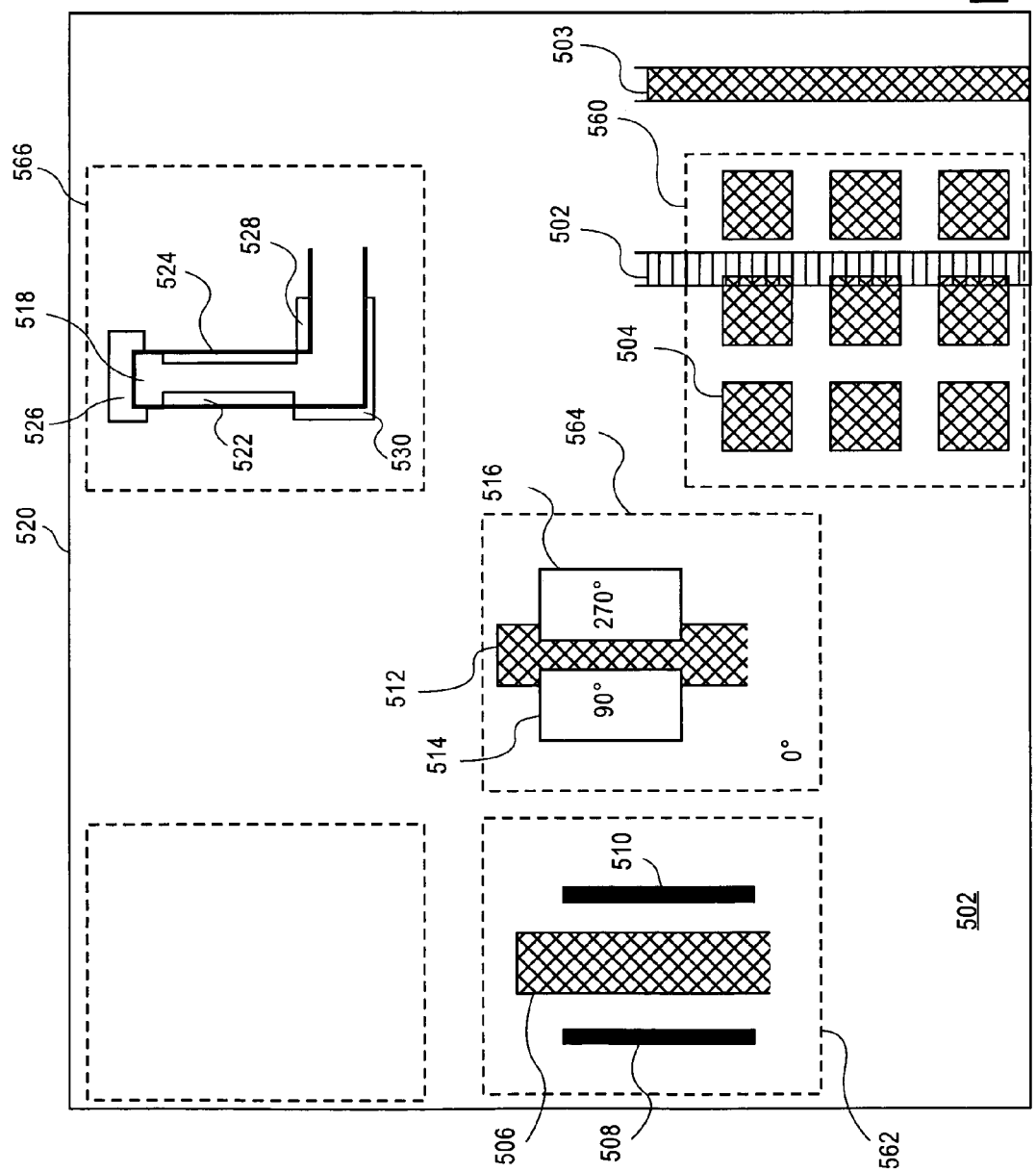
FIG. 5B illustrates a top view of a mask with example mask elements thereon.

FIGS. 5A and 5B are offered as illustrative examples of embodiments of context specific mask writing. Example design data and system processes are provided to help illustrate how such an embodiment may operate. Each figure presents an example of a mask comprised of a glass substrate 502 with various portions offered as examples of mask elements and manufacturing enhancement features.

An integrated circuit physical layout is the 'target' layout that the designer desires to be printed on the silicon wafer. It is comprised of various shapes which separately correspond to a functional electronic circuit element purpose and altogether to the circuit schematic with a well characterized circuit performance. The mask-level layout also includes other shapes which correspond to, and serve other, non-circuit purposes such as for lithography resolution enhancement with RETs, interlayer registration, or for other process enhancements such as planarization.

The degree of mask as well as final silicon fidelity of the various shapes should be determined based upon the circuit or process purpose and functional requirements of the shapes so as not to over-resolve or under-resolve the lithographic printing of the individual shapes most cost effectively and within functional specifications. In other words the feature resolution should be contextually related to the desired functional outcome.

FIG. 5A shows a number of various shapes along with an annotation of the shape's purpose, function, and required feature fidelity. The cross-hatched regions show one layer of many comprising an IC 'target' layout. The features include transistors for signal modulation or switching purposes, interconnect wires for the purpose of connecting digital or analog signals between various active and passive elements of the circuit, and power busses to provide power. Other elements include area fill patterns and logos identified with a diagonal lined pattern, as well as resolution enhancement technology features identified with solid black fill for 'additive' OPC features and dotted fill for 'subtractive' features. Only a few simple RET features are included for illustration as an actual number of features would overwhelm the illustrations and needlessly complicate the discussion. Of course, logos, alignment marks, and other non-circuit features, like fill cells, are typically well decoupled from the function of the circuit. However they can, through capacitive parasitic action at close for instance, electromagnetically couple into and affect the operation of a circuit. RET features are quite different in that they are typically not printed but singularly serve to improve the resolution as previously discussed.

Area 560

By way of one example of an embodiment, boxed area 560 of FIG. 5B demonstrates a plurality of area fill cell shapes, one of which is 504, on a mask substrate 502. Consider if the example fill cells 504 were placed in a non-critical area of a circuit solely to increase the pattern density in the area. These are often added to a mask to produce a set of structures on a chip that are not part of the electrical operation of the circuit, but rather to improve the topographical planarization, spatial homogeneity, or etch-back sidewall spacer width consistency of a given circuit layer.

From a mask and lithography perspective, even relatively large distortions or other defects associated with these features are unlikely to have a significant impact on planarization results due to operative physics in-play for this process. That is, the physics which explain and are used to model the relationship of area fill size and placement to resultant topography are related to fluid flow and distributed force of the CMP pad. These result in gradual response over a long spatial range, on the order of a very large number of lithographic critical feature dimensions. As such, when assessing the acceptable margin of error or tolerance for writing these features, a determination of the impact that lithographic distortions will have on the resulting IC must be made on the basis of the limiting physics associated with CMP and its corresponding range of influence. Although this example specifically uses CMP, fill is used to maintain more uniform physical conditions for several process steps such as etch, CMP, optical illumination, and others.

However, there may be other limiting physics in play as well. For example, these features may have interaction with functioning circuit elements such as with either adjacent wires 503 or wires on upper or lower layers 502. For the most part, the fill cells are decoupled from the function of the circuit, however it is possible that electromagnetic parasitic coupling of interconnect wires to fill cells can impact the circuit. Their limiting circuit-wise physics may be parasitic capacitive coupling. Small lithographic variations in size, on the order of fractions of a critical dimension, would probably have no impact on the circuit performance, reliability, or yield either. However there are conditions in which the non-impact must be confirmed through simulation which include these other physical effects when the possibility for significant deleterious impact on the circuit function or yield exists.

From analysis of the IC design data resident in the design database, the specific context associated with these features is provided for context-specific mask writing including information such as: the feature priority; the dimensional and location criticality; and the feature's defect tolerance. For this case, the feature priority may be very low priority; the dimensional criticality may be non-critical; and the mask tolerance to defects may be high.

With these example contextual parameters in mind, and referring to FIGS. 3 and 5B, an embodiment applied to this example may employ the following methods and systems to improve the mask writing process. Mask element 504 and the other fill cells in boxed area 560 may be designed in either an IC design process 302, or added later in a mask design process 306 and 308. Focusing on element 504, its polygonal shape, location, orientation and context information, such as its resulting circuit element's function and criticality, may be described by a plurality of data elements in data file 304. The data file 304 may be maintained in a database stored on computer readable media such as a hard disk and passed via software or hardware, or over an internet connection in ftp format for example, to a mask design process 306 and 308. Mask element 504 and its contextual information may then pass to an analysis block 306, wherein its context may be evaluated and its mask writing priority determined.

In this example, as a very low-level priority element in a non-critical mask area, standard writing system parameters and tolerances may be applied to element 504 with little further analysis. The shaped-beam parameters of the writing tool may be adjusted accordingly for low resolution and high speed. Alternatively, criteria for priority, criticality, dimensions, location, and sensitivity to defects, among others, may be applied to data for 504 to determine its manufacturing context and priority relative to the rest of the mask elements. In other words, analysis block 306 will determine in what order 504 will be written and with what precision.

Context and priority analysis 306 data may then be appended to or configured in block 308 to the initial design data 302 for mask element 504. In this example, this would mean that mask element 504 would have polygon location and context information identified together. Specifically, based on the example context information for 504 above, data may be appended to or configured in the design data to reflect the context and priority of element 504 in the manufacturing plan to write the mask.

As an example, the design file may contain various fields and identifiers, such as:

Circuit function=None (where the potential values or identifiers may include, for example: None, MOSFET, Critical Signal Interconnect, Power, or contact/via);

Circuit Function Priority=Low (where the potential values or identifiers may include, for example: Low, Medium or High);

Circuit Criticality=none (where the potential values or identifiers may include, for example: None, low, medium or critical);

Relative Mask Priority=none (where the potential values or identifiers may include, for example: none, low, medium or high);

Process Purpose=CMP fill mask (where the potential values or identifiers may include, for example: CMP fill mask, Critical feature mask, OPC feature, PSM feature, assist feature, or none);

Critical Processes (inferred Physics): CMP (where the potential values or identifiers may include, for example: CMP, Lithography, or mask);

Manufacturing Enhancements associated with this element?=No (where the potential values or identifiers may include, for example: yes or no);

Enhancement Priority=None (where the potential values or identifiers may include, for example: none, low, medium or high);

Dimension and Shape Fidelity=Low (where the potential values or identifiers may include, for example: low, medium or high);

Relative Location Importance=Low (where the potential values or identifiers may include, for example: low, medium or high);

Circuit Value=Low (where the potential values or identifiers may include, for example: low, medium or high);

Manufacturing Tips?=No (where the potential values or identifiers may include, for example: yes or no, with notes if necessary).

No specific format or terminology is required. For example, a different scale or other quantitative or qualitative values may be used. Additionally, the database may be re-ordered to place data for area 560 in an area or order within the mask database wherein it may be most efficiently and effectively retrieved.

This enhanced mask design data may be used by a mask writing system 310 to more efficiently apply a writing beam to a mask substrate in accordance with said context, priority, enhancement features and beam shape. For example, the mask writing system 310 may be directed to use as little time and writing precision (e.g. using the highest possible beam energy) to area fill cell 504 as possible, and to write such elements after the other elements have been completed. Element 504 would be written for example after high priority elements (such as those in boxed areas 564 and 566) have been written with great precision and carefully chosen energy distribution.

In an embodiment utilizing a shaped-beam mask writing system, such system may be controlled by the enhanced mask design data such that a broad write beam and single pass writing is applied to create the low-priority fill cells 504 as quickly and efficiently as possible. Additionally, due to its low priority, element 504 may be written with standard writing system parameters and tolerances, as opposed to the tailored writing requirements shown in the following examples.

Area 562

By way of further example, boxed area 562 of FIG. 5B shows a mask feature associated with an individual MOSFET gate 506 together with nearby subresolution assist features (SRAFs) (also called 'scattering bars'), 508 and 510. 506 is the design target, that is, what the designer wants to print on silicon, whereas the SRAFs are non-printing non-circuit features intended to improve linewidth control and depth of focus of the printed feature associated with 506. With this, consider the case where it is known from prior design analysis that 506 is an important but non critical element for the operation of the resulting circuit. That is on the basis of device and circuit contexts, the printed feature corresponding to 506 might not require the best lithographic fidelity possible to achieve the functional specifications. In this case 506 might have the following various associated contextual parameters for intelligent mask writing including: An indication that this is a gate of a non-timing and non-power critical MOSFET. But that there are unique lithographic and mask criticalities due to the use of SRAF features. Consequently there might be specific requirements for this triplet of features, such as a known low tolerance for mask write defects and line edge roughness. There may also be a required uniformity amongst other similarly grouped MOSFETs.

SRAF elements 508 and 510 are set at a precise size and a precise distance from 506 calculated to print a feature on the silicon wafer corresponding to target feature 506's dimensions as well as to improve the depth of focus of this feature. The three features together in this precise relationship with each other are responsible for the precise printing control of the target element 506. 508 and 510 have a higher than average mask and lithography criticality, because their misplacement or defects in their shape may have a significantly negative impact on the device resulting from mask element 506 or even on other adjacent elements of the circuit which are affected by them. Consider elements 508 and 510 to have various associated contextual parameters including: an indication that these are a highly precise SRAF features without any circuit function themselves, and that they work together as a doublet associated with target 506.

It's also important to consider the manner in which these MOSFETs are used in the circuit. In many circuits, particularly analog, matching the component values is more important than the actual values of the components. CMOS switches utilize matched pairs of P and N channel MOSFETs. As mismatching caused by manufacturing variations will result in functional variations, such as CMOS leakage or threshold variations, the criteria discussed for a single MOSFET may be less relevant than the requirements for the matched pair of MOSFET requirements of the CMOS device. A similar argument holds for analog elements such as sense amplifiers which demand contextual matched transistor interpretation. In fact, the variational relationship of transistors in these types of matched pairs is likely to be more important than the ensemble global variation of transistors. Therefore matched pair, or more generally matched n-tuples in various circuit blocks, should also be considered in context-specific mask writing or inspection methodologies.

With these example contextual parameters in mind, and referring to FIGS. 3 and 5B, an embodiment applied to this example may employ the following methods and systems to improve the mask writing process. Mask element 506 and scattering bars 508 and 510 may be designed in an IC design process 302, or scattering bars 508 and 510 may also be designed and added later as in a mask design process 306 and 308.

Focusing on element 506, its polygonal shape, location, orientation and context information, such as its resulting circuit element's function and criticality, may be described by a plurality of data elements in a data file. Mask element 506 and its contextual information may then pass to an analysis block 306, wherein its context may be evaluated and its mask writing priority determined manually or by a computer-aided automated process.

Other enhancements may also be added, either manually or by computer-aided process, based on element context and priority. In such an analysis block 306, as a medium-level priority element, standard writing system parameters and tolerances may be applied. Further, shaped-beam parameters of the writing tool may be adjusted accordingly for medium resolution and speed, for example. Alternatively, criteria for priority, criticality, dimensions, location, and sensitivity to defects, among others, may be applied to 506 manually or via automated process of comparison to determine its manufacturing context and priority relative to the rest of the mask elements. In other words, analysis block 306 will determine in what order 506 will be written and with what precision.

Context and priority analysis 306 data is then appended to or configured in block 308 to the initial design data 302 for mask element 506. In this example, this would mean that mask element 506 would be identified with its dimension, location, context and priority data, such that said mask element 506 is distinguished from such other elements as scattering bars 508 and 510. Specifically, based on the example context information above, data may be appended to or configured in the design data to reflect the context and priority of element 506 in the manufacturing plan to write the mask.

As an example, the design file may contain various fields and identifiers for element 506, such as:
Circuit function=MOSFET;
Circuit Function Priority=Medium;
Circuit Criticality=Medium;
Relative Mask Priority=Medium;
Process/device Purpose=functional target circuit feature;
Critical Issues=lithography and device physics;
Manufacturing Enhancements associated with this element?=Yes, 508 and 510;
Enhancement Priority=High;
Dimension and Shape Fidelity=Medium;
Relative Location Importance=Medium;
Circuit Value=Medium;
Manufacturing Tips?=Yes, write 508 and 510 as contemporaneously as practical since they are matched. See text accompanying area 560 above for further example field values for the various example identifier categories above.

Additionally, scattering bars 508 and 510 may also have their own individual data with similar data fields and values reflecting their function, criticality and other associated contextual data, such as, for example:
Relative Mask Priority=High;
Circuit function=None;
Process Purpose=OPC;
Dimension and Shaped Fidelity=High; and
Relative Location Importance=High.

No specific format or terminology is required. For example, a different scale or other quantitative or qualitative values may be used. Additionally, the database may be re-ordered to place data for area 562 in an area or order within the mask database wherein it may be most efficiently and effectively retrieved.

This enhanced mask design or manufacturing plan data may be used by a mask writing system 310 to more efficiently apply a writing beam to a mask substrate in accordance with said context, priority, enhancement features, and beam shape of elements 506, 508 and 510. For example, the mask writing system 310, may be directed to utilize greater time and precision to pattern the scattering bars 508 and 510 with extra fidelity required because of the high priority they are given.

Per the manufacturing tip, elements 508 and 510 may be written together, with element 506 written before or after to allow for dissipation of any built up heat caused by the writing beam in creating 508 and 510. Additionally, element 506 may be written after other higher priority elements, such as those in boxed areas 564 or 566, as 506 is important, but not critical, and of medium mask priority. Element 506 may also be written more quickly or with different beam energy settings than higher priority elements.

Area 564

Box 564 in FIG. 5B shows an alternating aperture phase shifting mask (altPSM) example with a 90-degree phase shift region 514 and a 270-degree phase shift region 516 adjacent to a chrome line 512 on a clear field 0-degree phase background. This style of single-exposure altPSM is used for conceptual simplicity only, as it is in general not a technique used in the industry.) 516, is the design target feature, the feature shape and dimension that the designer desires to print on the silicon wafer. The phase shifting areas 514 and 516 are optical enhancement features only, and are intended to improve the resolution and/or depth of focus of the printed circuit feature associated with 512 beyond what would be achievable without this technique.

PSM masks such as this require multiple processing steps to define the three or more types of transmission and phase structures on the single photomask. That is, for this simple single-exposure approach: (1) the chrome, 512, must be defined; then subsequently (2) the 90 degree shifter, 514, must be defined and etched, and then followed by (3) the 270 degree shifter must be defined and etched separately.

The element 512 may be associated with a medium critical MOSFET transistor gate and is the intended target shape to be printed. The operative physical effects which are considered in the classification and prioritization of these features are primarily lithographic imaging effects, unique requirements and effects of a single exposure altPSM, and short-channel 3-dimensional device effects due to variations along the width as well as the length of this short channel MOSFET which may impact key IC performance parameters and therefore parametric yield.

By way of another example of an embodiment, boxed area 564 of FIG. 5B shows a mask target element 512 intended to produce a MOSFET transistor, which is known from a-priori design information to be important and of medium criticality to the performance of the circuit.

Consider if element 512 were to have various associated contextual design parameters for intelligent mask writing determined by prior analysis including: high priority, medium dimensional tolerances, located on a timing critical network of the circuit; having high fidelity requirements, and mid-range sensitivity to mask writing defects.

Elements 514 and 516 are phase shifting mask (PSM) features associated with element 512. Elements 514 and 516 have 90-degree and 270-degree phase shifting properties, respectively. Such PSM features are added to shift the phase of the light passing through each side of a mask feature in order to increase optical contrast and enable greater lithographic resolution and depth of focus. Consider these PSM elements associated with 512 to have their own various associated contextual design parameters, such as: low priority; high fidelity requirements; high sensitivity to mask writing defects, and no circuit function themselves.

Mask patterning error effects in the resulting circuit may be compounded due to the highly non-linear nature of deep subwavelength lithographic printing combined with the non-linear channel-length-to-voltage threshold or drive current relationships for example. Phase shifter sizes as well as each shifter's etch depth and undercut may also be critical. For purposes of this illustrative example, assume that element 512 is a high priority element, located in a non-critical mask area, and with strict dimension and location specifications. Elements 514 and 516 are written at completely separate steps in the mask fabrication flow however their alignment with 512 is critical. So assume that elements 514 and 516 may be of low priority compared with other similar altPSM features however with very tight location and dimension requirements.

With the above example contextual parameters in mind, and referring to FIGS. 3 and 5, an embodiment applied to this example may employ the following methods and systems to improve a mask writing process.

Mask element 512 and the PSM features 514 and 516 may be designed in an IC design process 302, or, alternatively, PSM features 514 and 516 may be designed and added later in the mask design process 306 and 308.

The polygonal shape data for 512, along with location, orientation and other context information, such as the circuit element's function and criticality, may be described by a plurality of data elements in data file. Mask element 512 and its contextual information may be passed to an analysis block 306, wherein its context may be evaluated and its priority determined manually or by a computer-aided automated process. In this analysis block 306, as a high priority element, criteria for priority, criticality, dimensions, location, and sensitivity to defects, among others, may be applied to 512 manually or via automated process of comparison to determine that element's mask writing context and priority relative to other mask elements. In other words, block 306 may determine in what order and with what precision element 512 will be written in comparison with the other (chrome level) features.

RET and other enhancements may also be added at the chrome level or at either of the phase levels, such as PSM features 514 on one level, and 516 on the other. Their context and priority may be assigned based upon the requirements associated with 512. Further, shaped-beam parameters of the writing tool may be adjusted accordingly for medium or high resolution and medium speed.

Context and priority analysis 306 data may be appended to or configured in block 308 to the initial design data 302 for said mask element 512. In this example, this would mean that mask element 512 would be identified with its polygon location, context, and priority data.

Specifically, based on the example context information for 512 above, data may be appended to or configured in the mask design data to reflect the context and priority of element 512 and to operate as a contextual manufacturing plan for writing the mask. As an example, the design file may contain various data fields and identifiers for 512, such as:

Circuit function=MOSFET;
Circuit Function Priority=High;
Circuit Criticality=Medium;
Relative Mask Priority=Medium;
Process Purpose=functional target mask feature;
Critical Processes (and inferred Physics): lithography;
Manufacturing Enhancements for this element?=Yes, 514 and 516;
Enhancement Priority=low;
Dimension and Shape Fidelity=High;
Relative Location Importance=Medium;
Circuit Value=Medium;
Manufacturing Tips?=No.

See text accompanying AREA 560 above for further example field values for the various example identifier categories above.

Additionally, PSM features 514 and 516 may have their own individual data above with similar data fields and values reflecting their function, criticality and other associated contextual data, including, for example:

Circuit function=None;
Circuit Function Priority=Low;
Circuit Criticality=None
Process Purpose=90 PSM feature;
Critical Processes (inferred Physics): lithography. and
Circuit function=None;
Circuit Function Priority=Low;
Circuit Criticality=None;

Process Purpose=270 PSM feature;
Critical Processes (inferred Physics): lithography.

No specific format or terminology is required. For example, a different scale or other quantitative or qualitative values may be used. Additionally, the database may be re-ordered to place data for area 564 in an area or order within the mask database wherein it may be most efficiently and effectively retrieved.

The enhanced mask design data may be used by a mask writing system 310 to more efficiently apply a writing beam to a mask substrate in accordance with said context, priority, enhancement features and beam shape. For example, element 512 may be written after other higher priority elements, such as those in boxed area 566, as 512 is of medium priority and is important, but less critical than 566. Element 512 may also be written more quickly or with less energy than higher priority elements. Elements 514 and 516, as discussed, are defined on the photomask during separated physical writing steps, however these features such as with 512 are similarly prioritized in relationship to other features during these steps.

Area 566 Critical MOSFET

By way of a final example of an embodiment of context specific mask writing, the boxed area at 566 in FIG. 5B shows a mask element 518 intended to produce on a wafer a functional transistor element, a MOSFET gate that is timing critical to the ultimate performance and functionality of the circuit.

The accuracy with which this feature must be written or inspected is most accurately ascertained on the basis of a-priori knowledge of how well the circuit behaves throughout the range of the feature distortion under normal process excursions. Also, digital circuits have far different requirements than analog. For example, in some but not all cases, digital circuits are relatively insensitive to variations in some transistor gate dimensions due to the way the circuit is designed. So in the most general terms, the writing and/or inspection criteria must consider many factors including what type of transistor this is, what its purpose is, what type of circuit it is in etc. This information can be elicited from the IC design database and simulation.

Element 518 is the intended target or physical layout structure. Elements 522, 524, 526, 528 and 530 are Optical Proximity Correction (OPC) features for element 518. As described previously, these OPC features are used to enhance the resolution of element 518. 522 and 524 are subtractive OPC features, which are areas subtracted from the target feature area when a mask is written. The other OPC features are additive, that is, they are areas added to the target feature area when the mask is written.

From the IC design database information concerning the functional as well a certain manufacturing attributes of the device this feature is associated with and its relevance to the function of the overall IC is available. For example, information regarding relationships between features on different layers, information relating these features to digital or analog analog circuit contexts, or describing whether the features were a part of a timing critical network is available. Additionally, information regarding fabrication design rules, SPICE model parameters, inter-device relationships (e.g. is this a component of a 'matched pair' device), and so on is available.

Therefore, from analysis including lithography and device simulations prior to mask writing the fidelity requirements for the mask features formed by the combined sum of elements 518, 522, 524, 526, 528 and 530 may be determined. From this, the various associated contextual parameters for intelligent mask writing might be: MOSFET transistor gate, high priority; high printing fidelity; located on a critical timing net and power net of the circuit; and high sensitivity to mask writing defects.

With the above example contextual parameters in mind, and referring to FIGS. 3 and 5B, an embodiment applied to this example may employ the following methods and systems to improve the mask writing process. Mask element 518 and its OPC features (522-530) may be designed in an IC design process 302, or OPC features 522-530 may alternatively be designed and added later as RET in the mask design process 306 and 308.

Focusing on element 518, its polygonal shape, location, orientation and other context information, for example, the circuit element's function, criticality and priority, may be described by a plurality of data elements in data file. Mask element 518 and its contextual information may then pass to an analysis block 306, wherein its context may be evaluated and its mask writing priority determined. In such an analysis block 306, as a high priority element, criteria for priority, criticality, dimensions, location, and sensitivity to defects, among others, may be applied to 518 to determine its mask writing context and priority relative to the other mask elements. In other words, block 306 may determine in what order and with what precision 518 will be written. RET and other enhancements may also be added, such as OPC features 522, 524, 526, 528 and 530, based on element context and priority. Further, shaped-beam parameters of the writing tool may be adjusted accordingly for high resolution.

Context and priority analysis 306 data may be appended to, or configured in, 308 to the initial design data 302 for said mask element 518. In this example, this would mean that mask element 518 would be identified together with its dimension, location, context and priority data, such that said mask element 518 is distinguished from such other mask features as the OPC elements 522, 524, 526, 528, 530. Specifically, based on the example context information above, data may be appended to or configured in the design data to reflect the context and priority of element 518 in the manufacturing plan to write the mask.

As an example, the design file may contain various data fields and identifiers for 518, such as:
Circuit function=MOSFET;
Circuit Function Priority=High;
Circuit Criticality=High;
Relative Mask Priority=High;
Process Purpose=functional target mask feature;
Critical Processes (inferred Physics): lithography, device physics;
Manufacturing Enhancements for this element?=Yes, 522-530;
Enhancement Priority=low;
Dimension and Shape Fidelity=High;
Relative Location Importance=High;
Circuit Value=High;
Manufacturing Tips?=Yes, write contemporaneously with OPC 522-530.

See text accompanying area 560 above for further example field values. Additionally, OPC features 522-530 may have their own individual data above with similar data fields and values reflecting their function, criticality and other associated contextual data, such as, for example:
Circuit function=None;
Circuit Function Priority=Low;
Circuit Criticality=None;
Process Purpose=OPC feature;

Critical Processes (inferred Physics): lithography.

No specific format or terminology is required. For example, a different scale or other quantitative or qualitative values may be used. Additionally, the database may be re-ordered to place data for area 566 in an area or order within the mask database wherein it may be most efficiently and effectively retrieved.

For this example, the transistor target linewidth margin is small and critical. All of the OPC features and the precision with which they are written on the mask impact the linewidth. However the linewidth is primarily controlled on the mask and in the lithographic system by the ensemble of elements 518, 522, and 524. Therefore, following the analysis block, this ensemble may be written first, with a carefully chosen energy distribution, a pinpoint writing beam and a slow beam trajectory, and multipass writing because of its critical circuit value and high priority relative to other mask elements. Similarly, the transistor line end pullback and corner fidelity is determined by their unique ensemble of OPC features and dimensional requirements. The priority and precision with which these ensembles are written may result in using a broader write beam, faster beam trajectory, and single-pass writing.

For this example overall, then, contextual and priority data for the various mask elements may be evaluated to produce a manufacturing plan for writing the mask in a more efficient manner. Specifically, the resultant mask design file and manufacturing plan would be configured to direct the writing beam accordingly. Using the lower energy and a small write aperture, the following elements would be written in order: 506, 508, and 510, and the feature resulting from the overlap of 518, 522, 526, 528, 530, and 524. Following those and with a higher energy, a faster beam traverse rate and a wider beam shape, if available, the following elements would be written in order: 512, and the endcap of 518 (unlabeled) and finally with an even wider beam element 504.

FIGS. 6A through 6G show examples of information provided by considering design features with respect to the context of the design. This context information, which may be used to identify critical features, is significantly more useful than labeling each design feature with a tag that provides no indication as to why or how the feature is critical. The element is a via, represented as a larger square on a first layer and a smaller square on a second layer. The context of the via can be used to identify which features of the via are critical. A fabrication rule may state that the via is completely enclosed by the first layer, even in the presence of process uncertainty. The smaller square on the second layer may be in different locations relative to the larger square on the first layer.

Figure 6A:
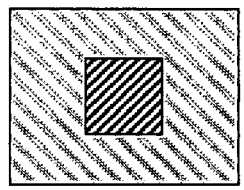
FIGS. 6A-6G illustrate some examples of designs in which having contextual information is beneficial.
Figure 6B:
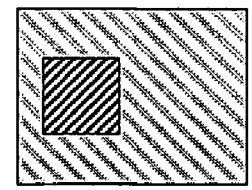
Figure 6C:
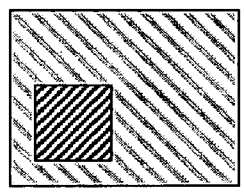
Figure 6D:
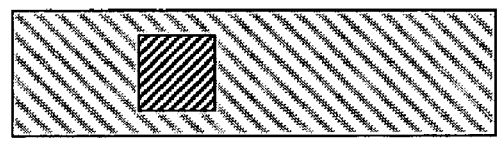
Figure 6E:
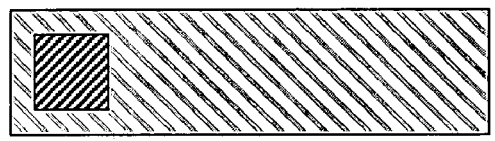
Figure 6F:
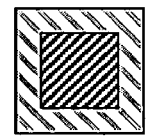
Figure 6G:
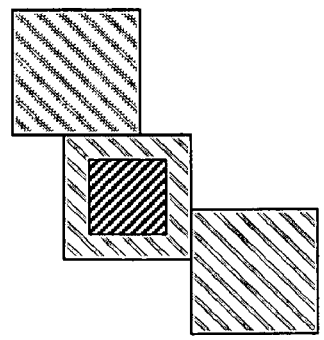

For the embodiment of FIG. 6A, the placements of the sides are not critical. As shown in FIG. 6B, one side is critical. In FIGS. 6C and 6D, two sides are critical. FIG. 6E shows an example having three sides that are critical. In FIG. 6F, placement of all four sides is critical. In FIG. 6G, portions of some edges are critical and others are not. The vias themselves, and some of the constraints (such as minimum area for example), are identical in FIGS. 6A through 6F. However, whether the edge placement is critical (and hence worth the cost of providing increased accuracy during the mask writing, or is rejected as a defect during the mask inspection), may not be determined from the fact that the figure represents a via, or by marking the via as critical. Rather, the context information may be used to determine the critical and non-critical features of the via. In this case, the context information could be used to individually mark each edge as critical or non-critical.

We claim:

1. A method for writing a mask, comprising:
   determining electronic properties of features in the mask;
   determining physical geometric properties of features in the mask;
   determining manufacturing properties for features in the mask, wherein design data comprises the electronic, physical, and manufacturing properties;
   analyzing the design data;
   configuring the design data to reflect the analysis determining one or more appropriate shapes or energy levels for a beam for writing the elements based on the design data; and
   writing the features of the mask based on the analyzed design data using the one or more appropriate shapes or energy levels for the beam.

2. The method of claim 1, wherein analyzing the design data comprises comparing each feature to a set of threshold values.

3. The method of claim 2, wherein the set of threshold values include inter-relationship thresholds, functionality thresholds, and criticality thresholds.

4. The method of claim 3, wherein the inter-relationship thresholds comprise: association of matched transistor pairs, and crossing of raster stripes.

5. The method of claim 3 wherein the functionality thresholds comprise:
   feature type, feature function, feature purpose.

6. The method of claim 3, wherein the criticality thresholds comprise:
   circuit criticality, critical processes, relative mask priority, circuit fan priority, circuit value, dimension and shape fidelity, and location importance.

7. The method of claim 1, wherein writing each feature comprises:
   determining if multipass writing is appropriate for the feature based on the configured design data; and
   writing each features using multipass writing if it is appropriate.

8. The method of claim 1, wherein writing each feature comprises:
   determining if raster stripe sharing is appropriate for the feature based on the configured design data; and
   writing each feature using raster stripe sharing if appropriate.

9. A system for writing a mask, comprising:
   means for determining electronic properties of features in the mask;
   means for determining physical geometric properties of features in the mask;
   means for determining manufacturing properties for features in the mask, wherein design data comprises the electronic, physical, and manufacturing properties
   means for analyzing the design data;
   means for configuring the design data to reflect the analysis; means for determining one or more appropriate shapes or energy levels for a beam for writing the elements based on the design data; and
   means for writing the features of the mask based on the analyzed design data using the one or more appropriate shapes or energy levels for the beam.

10. The system of claim 9, wherein the means for analyzing the design data comprises means for comparing each feature to a set of threshold values.

11. The system of claim 10, wherein the set of threshold values include inter-relationship thresholds, functionality thresholds, or criticality thresholds.

12. The system of claim 11, wherein the inter-relationship thresholds comprise: association of matched transistor pairs.

13. The system of claim 11 wherein the functionality thresholds comprise:
feature type, feature function, feature purpose.

14. The system of claim 11, wherein the criticality thresholds comprise:
circuit criticality, critical processes, relative mask priority, circuit fan priority, circuit value, dimension and shape fidelity, and location importance.

15. The system of claim 9, wherein the means for writing each feature comprises:
means for determining if multipass writing is appropriate for the feature based on the configured design data; and
means for writing each features using multipass writing if it is appropriate.

16. The system of claim 9, wherein the means for writing each feature comprises:
means for determining if raster stripe sharing is appropriate for the feature based on the configured design data; and
means for writing each feature using raster stripe sharing if appropriate.

17. A computer program product embodied on computer readable medium, the computer readable medium having stored thereon a sequence of instructions which, when executed by a processor, causes the processor to execute a method for writing a mask, the method comprising:
determining electronic properties of features in the mask;
determining physical geometric properties of features in the mask;
determining manufacturing properties for features in the mask, wherein design data comprises the electronic, physical, and manufacturing properties;
analyzing the design data;
configuring the design data to reflect the analysis; determining one or more appropriate shapes or energy levels for a beam for writing the elements based on the design data; and
writing the features of the mask based on the analyzed design data using the one ore more appropriate shapes or energy levels for the beam.

18. The computer program product of claim 17, wherein analyzing the design data comprises comparing each feature to a set of threshold values.

19. The computer program product of claim 18, wherein the set of threshold values include inter-relationship thresholds, functionality thresholds, and criticality thresholds.

20. The computer program product of claim 19, wherein the inter-relationship thresholds comprise: association of matched transistor pairs, and crossing of raster stripes.

21. The computer program product of claim 19 wherein the functionality thresholds comprise:
feature type, feature function, feature purpose.

22. The computer program product of claim 19, wherein the criticality thresholds comprise:
circuit criticality, critical processes, relative mask priority, circuit fan priority, circuit value, dimension and shape fidelity, and location importance.

23. The computer program product of claim 17, wherein writing each feature comprises:
determining if multipass writing is appropriate for the feature based on the configured design data; and
writing each features using multipass writing if it is appropriate.

24. The computer program product of claim 17, wherein writing each feature comprises:
determining if raster stripe sharing is appropriate for the feature based on the configured design data; and
writing each feature using raster stripe sharing if appropriate.

* * * * *